United States Patent [19]

Elms

[11] Patent Number: 5,406,071
[45] Date of Patent: Apr. 11, 1995

[54] OPTICALLY ISOLATED PULSE WIDTH MODULATION METERING

[75] Inventor: Robert T. Elms, Monroeville Boro, Pa.

[73] Assignee: Eaton Corporation, Cleveland, Ohio

[21] Appl. No.: 95,115

[22] Filed: Jul. 20, 1993

[51] Int. Cl.[6] .................. H01J 40/14; G02B 27/00; G01R 23/06
[52] U.S. Cl. .................. 250/214 A; 250/551; 327/35
[58] Field of Search .................. 250/551, 214 A; 307/519, 234, 265, 240; 328/58

[56] References Cited

U.S. PATENT DOCUMENTS

| | | | |
|---|---|---|---|
| 4,310,755 | 1/1982 | Miller | 250/214 A |
| 4,594,578 | 6/1986 | Walsh | 307/265 |
| 5,130,526 | 7/1992 | Mischel | 250/214 A |
| 5,283,441 | 2/1994 | Fabian | |

OTHER PUBLICATIONS

Instructions for Advantage Control Modules Used with Full-Voltage Two-Speed Advantage Motor Starters and Contactors Jun. 1992.

*Primary Examiner*—William L. Sikes
*Assistant Examiner*—Tiep H. Nguyen
*Attorney, Agent, or Firm*—Martin J. Moran

[57] ABSTRACT

A process variable such as the load current supplied through an electrical contactor is encoded as a 4 to 20 mA current signal via an optically coupled pulse width modulated output circuit. A microprocessor produces the pulse width modulated signal at a duty cycle varying with the load current. The LED of an opto-coupler transfers the signal to a phototransistor, and a voltage regulator and switching circuit drive the phototransistor so as to minimize switching times. The voltage regulator maintains a DC voltage at the collector of the phototransistor, which is operated at a constant emitter current. The LED supplies base current to the phototransistor when the pulse width modulated signal is high. An amplifier is coupled to the emitter of the phototransistor, and the output of the amplifier is coupled back to the base of the phototransistor via a Schottky diode pair. The amplifier output varies with whether or not the base current needed to maintain constant emitter current is obtained from the LED. The amplifier output is coupled via a comparator and a low pass filter to a current driver including an amplifier and a drive transistor. The DC component of the current output varies with a duty cycle of the pulse width modulated signal, providing a 4 to 20 mA output current with variation of the load current between zero and 200% of rated load current.

14 Claims, 6 Drawing Sheets

OPTICALLY ISOLATED PULSE WIDTH MODULATION METERING

BACKGROUND OF THE INVENTION

1. Field of the Invention

The invention relates to the field of electronic metering of variables such as the power consumption of a motor or other load. A controller module for a motor starter or contactor generates a pulse width modulated metering signal representing the level of power consumption by the load. The metering signal is coupled through an output stage having an opto-coupler, voltage regulator and comparator arranged to minimize switching times, and a current output transistor developing a 4 to 20 mA metering output signal.

2. Prior Art

Watt meters that sense the power line voltage and current supplied to loads are commonly used, for example, with integrating means operable to accumulate power usage. The sensing and integrating means can be electrical, mechanical, or a combination of the two. In industrial applications, average load current is a useful indication of power usage for purposes of automatic control. Accordingly, the level of power usage is encoded in an electric signal.

Sensing and control instrumentation for particular applications may encode information such as the level of a process variable via analog or digital signals, and it is frequently necessary to convert the information from one form to another to achieve certain objectives. Obtaining high accuracy or resolution of the encoded information is one concern. Other concerns include the number of conductors or signal lines needed to carry the information, the speed of the signalling path, its noise immunity, and the power requirements. Whereas digital encoding to a high resolution requires a high number of parallel or serial bits, the signal may be encoded as an analog current or voltage for signalling using a single conductor pair.

Monitoring and control instrumentation can be coupled to signals associated with inductive load circuits across optical couplers to protect the monitoring and control instrumentation from the influence of inductive surges and the like. The optical couplers provide an LED on the inductive side of the circuit and a phototransistor on the protected side, responsive to the LED. Optical couplers are not particularly high speed switching devices as compared to switching transistors. This is due to the large base-collector area of the phototransistor of the optical coupler. The switching time also is affected by the resistance and capacitance of the load circuit coupled to the output of the phototransistor, typically the collector of the phototransistor.

An optical coupler is a digital (on/off) device and is not conventionally used in an analog signal path. However, the opto-coupler can be operated in a manner that is digital but continuously variable like an analog signal. This is accomplished by varying the pulse width applied to the opto-coupler, i.e., by pulse width modulation. In that case, the switching time of the opto-coupler circuit is a critical consideration. To accurately reproduce the pulse width of the digital signal across the optical isolation barrier, the switching time of the optical coupler either must be very short, or must be precisely equal as to turn-on and turn-off time, regardless of variations between devices, variations in temperature, etc. Unless the switching times are very short compared to the pulse width variations, the optical coupler will introduce an error into the data encoded by the variable pulse width.

A number of control and interface circuits are available for signalling the levels of process variables via current signals. One standard specification is a 4 to 20 mA current output having an offset (4 mA) and a deflection proportional to the level of the process variable over an arbitrary "full" scale. The process variable may be encoded by an analog circuit at the sensing (transmitting) end, coupled to a monitoring and/or control system at the receiving end over a shielded twisted pair. Common mode noise is rejected at the receiving end, and the offset is subtracted. The deflection between zero and the arbitrary full scale is factored to recover the desired information, and often digitized, providing a numerical factor that is related to an actual measurement of the respective physical unit, e.g., wattage, temperature, pressure, displacement or other sensed physical parameter that is being monitored or controlled.

In the environment of the present invention, the average current consumption of a load coupled to an electrical contactor or motor starter is encoded in a current signal as described. Contactors or motor starters historically were wired to relay ladder networks to control starting, stopping, speed changes, reversing, etc. Typically, the contactor/starter circuits include circuit breakers for protection from overcurrent and/or undervoltage conditions. With the availability of inexpensive microprocessor chips, most of the logical functions of a relay ladder are provided by the processor, at substantially reduced expense and with much less circuit complexity.

The Westinghouse Electric Corporation ADVANTAGE ™ line of electrical contactors provides a modular system of contactors, protective features and controls using microprocessors. A control module is coupled to one or more contactors for coupling the load to the power line in alternative configurations, for example wye or delta couplings of a three phase motor, and obviates the wiring associated with a relay ladder. The power consumption load on the motor can be approximated from the average current loading of the respective phases, which advantageously is determined numerically by a processor module coupled to the contactor.

In order to integrate the load into an industrial process or the like, the signal representing power consumption of the load must be transmitted to the monitoring or control instrumentation that advantageously is operated as a function of load power consumption. Both analog and digital aspects are involved in switching the contactor on and off, reporting alarms in the event of overload conditions or a trip due to overload, sensing current and voltage, determining the motor loading current, and reporting the data in a manner that is useful for interfacing to other monitoring/control devices. It would be advantageous to arrange such a combination of analog and digital aspects to obtain high resolution of the encoded information, a minimum of wiring and signal lines, minimal power requirements, good noise immunity, and high speed.

SUMMARY OF THE INVENTION

It is an object of the invention to provide an optically isolated interface circuit for a pulse width modulated digital output signal that has minimal switching time and minimal power requirements.

It is another object of the invention to produce a standard 4 to 20 mA current output as a function of a pulse width modulation signal representing the level of power consumption of a load coupled to a contactor or motor starter.

It is a further object of the invention to regulate the current in the phototransistor output stage of an opto-coupler for maintaining constant collector-emitter current in the phototransistor, and to use the current supplied to the phototransistor as a drive signal for a proportional output signal.

These and other objects are accomplished by an apparatus for encoding the value of a process variable such as the load current supplied through an electrical contactor via an optically coupled pulse width modulated output circuit. A microprocessor produces the pulse width modulated signal at a duty cycle varying with the load current. The LED of an opto-coupler transfers the signal to a phototransistor, and a precision voltage regulator and switching circuit drive the phototransistor so as to minimize switching times. The voltage regulator maintains a DC voltage at the collector of the phototransistor, and supplies current to the phototransistor when the pulse width modulated signal is high. A comparator is responsive to the emitter of the phototransistor and drives the base of the phototransistor via a Schottky diode pair. The comparator output also is coupled to a low pass filter and to a current driver including an amplifier and a drive transistor. The DC component of the current output varies with a duty cycle of the pulse width modulated signal, providing a 4 to 20 mA output current with variation of the load current between zero and 200% of rated load current.

The comparator comprises an operational amplifier coupled to the emitter of the phototransistor and to a reference voltage divided down from the precision voltage regulator. This operational amplifier forces the phototransistor to conduct a fixed emitter current by modulating the phototransistor base current applied by the operational amplifier through the Schottky diodes.

The operational amplifier supplies current to the base of the phototransistor when the phototransistor is not illuminated by the LED, such that the phototransistor remains in conduction. The Schottky diode pair effectively senses whether the phototransistor is remaining in conduction due to base current supplied by the LED or due to current fed back from the output of the operational amplifier, and substantially shortens the switching time of the circuit through the opto-coupler, by operating the phototransistor at a substantially constant emitter current.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
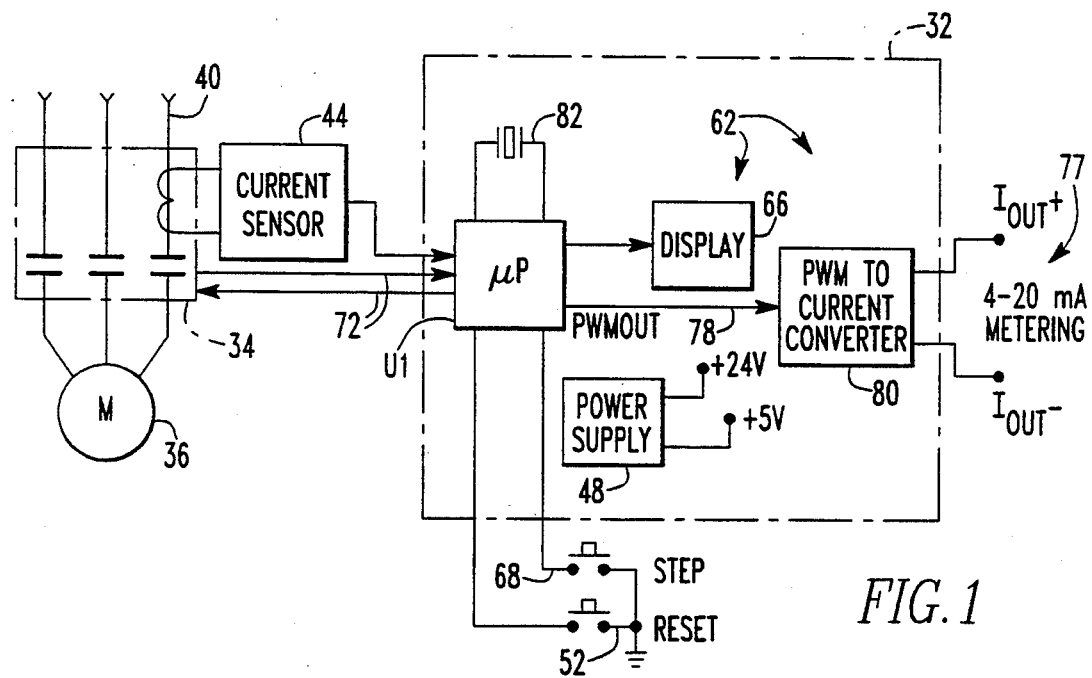
FIG. 1 is a generalized schematic diagram of a contactor control circuit with optically isolated pulse width modulation metering according to the invention.

FIG. 1 shows generally a meter module 32 arranged to interface with a contactor or motor starter 34 coupling a load 36 to a power line 40. The average current loading of the load 36 is reported to the meter module 32 from the contactor/starter 34, which preferably includes a modular current sensing circuit 44 that integrates the absolute value of current loading over AC power cycles. The current sensing circuit 44 can be one of a plurality of such circuits that are respectively operable to monitor contactors coupled to the meter module 32 such that the respective contactors are controlled in a coordinated manner for starting, stopping, reversing and/or speed control, as well as achieving protective functions such as shutting down on an overcurrent condition or other fault detection.

Figure 2:
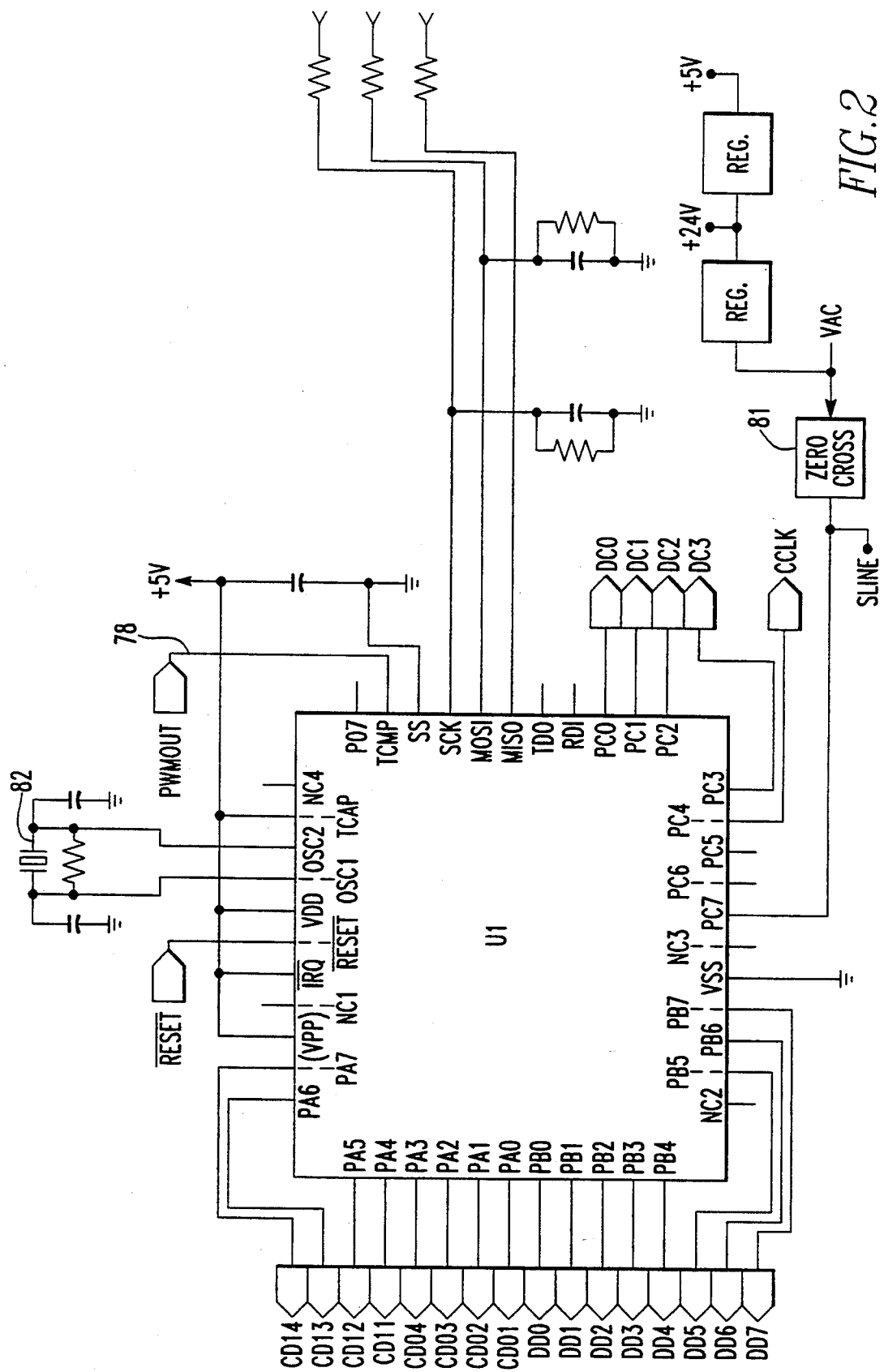
FIG. 2 is a schematic circuit diagram showing a part of the contactor control circuit.

The meter module 32 includes a microprocessor U1, power supplies 48, 49 at 24 and 5 VDC, and reset means 52, as shown in FIG. 1. The meter module 32 as also shown in more detail in FIGS. 2, 3a and 3b, using the same reference numbers for the same elements. The meter module 32 can include interface drivers 62 and receivers 64, coupled by a bus to the microprocessor U1, for controlling a display 66 and for input/output signalling functions. The microprocessor U1 can be a Motorola 6805 or the like.

The contactor or starter module 34 may in fact be a control module which operates one or more contactors 34 in a coordinated manner to effect load functions. For a three phase motor, for example, the contactors 34 may select the configuration in which motor windings are coupled m the power line 40 (or decoupled or shorted), for starting, stopping, speed changes, :reversing and the like. The contactors 34 (one being shown in FIG. 1 ) report back: their status to the meter module 32, over signal lines 72 coupling the contactors 34 to the meter module 32. In addition to reporting average current loading, the contactors 34 report the open/closed state of their contacts, overload alarm conditions and trip status of their overload protection means.

Figure 3A:
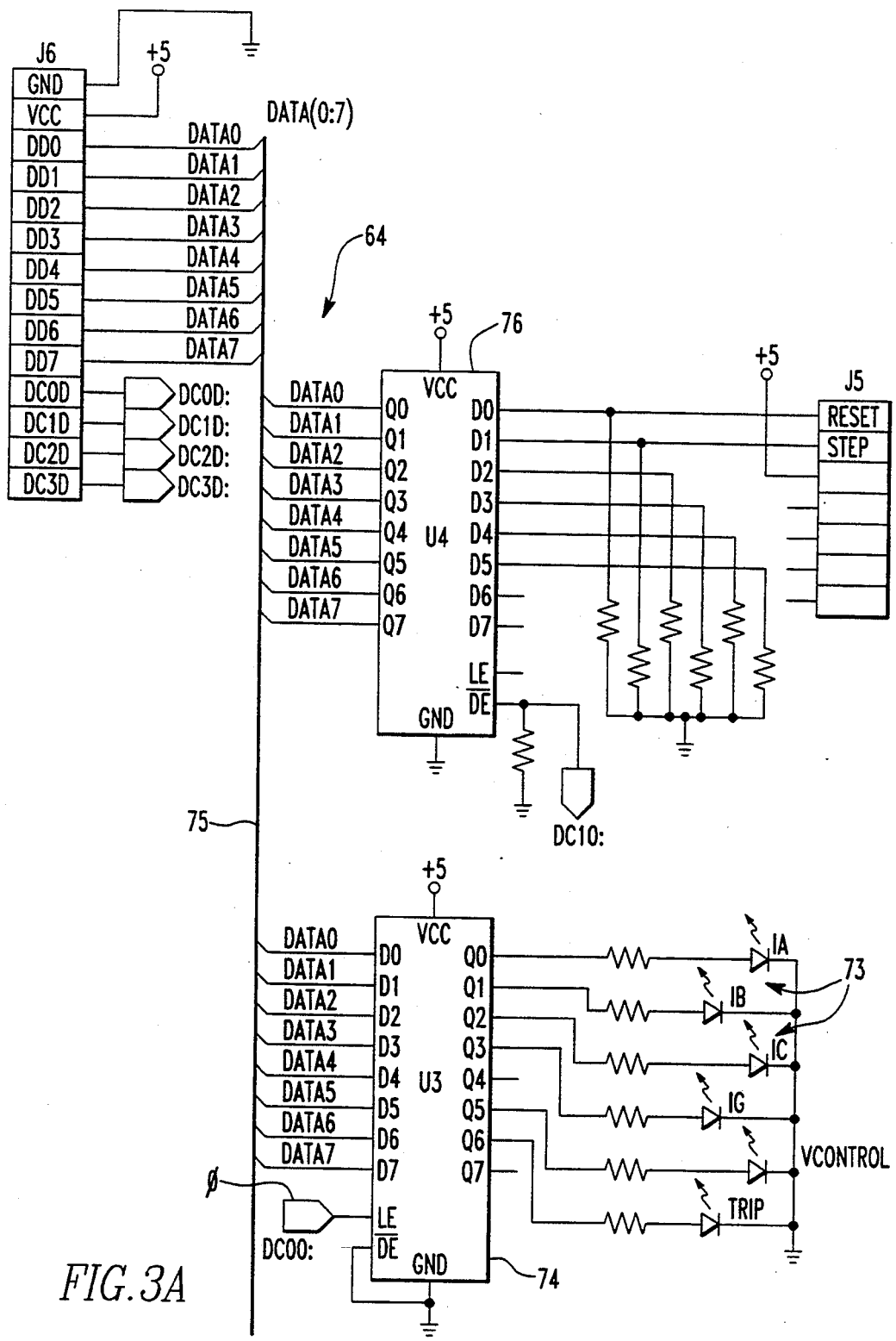
FIGS. 3a and 3b are associated portions of a schematic circuit diagram showing an additional part of the contactor control circuit.
Figure 3B:
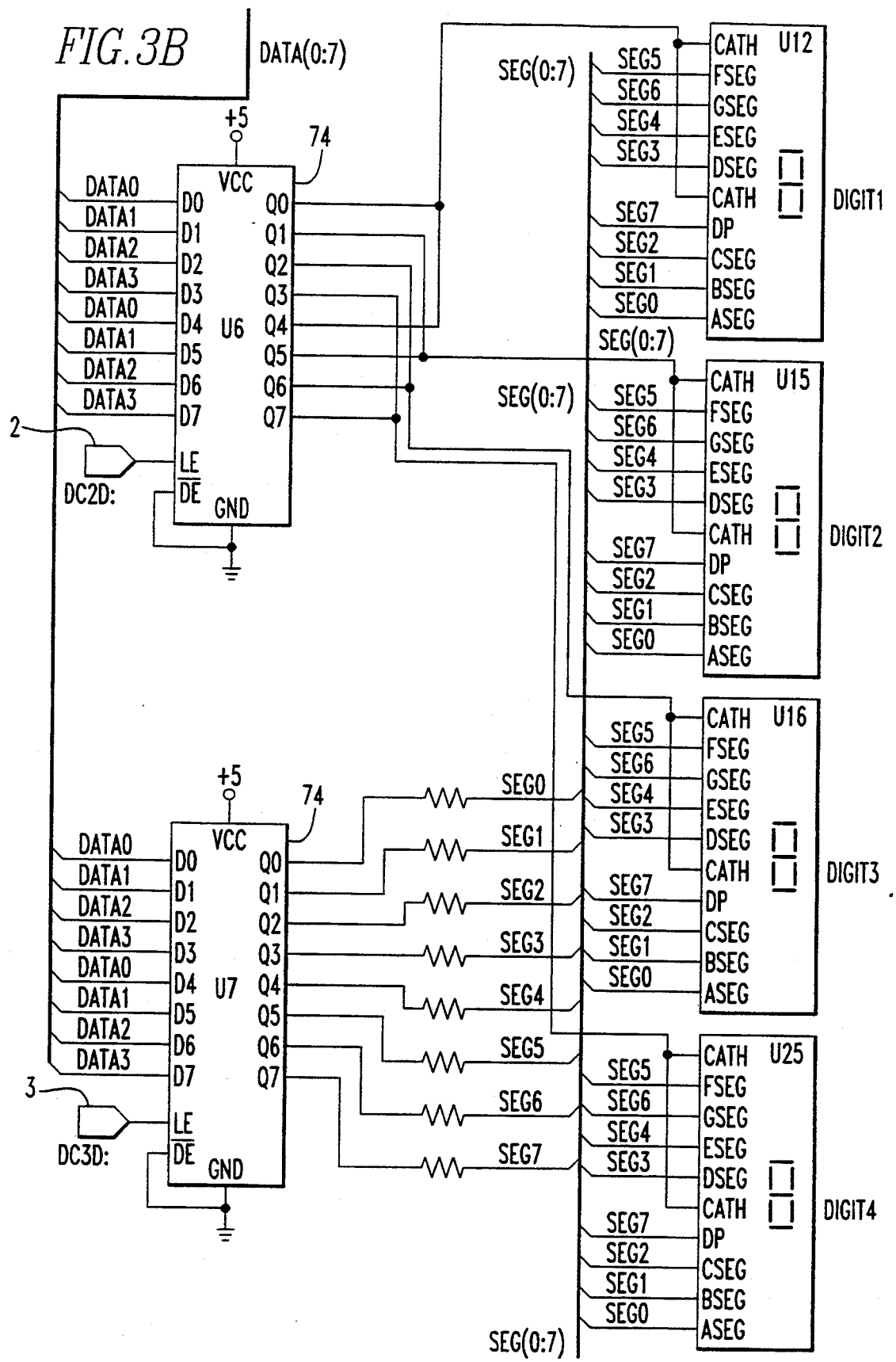

The module display 66 can be a four digit seven segment display as shown in FIGS. 3a and 3b, for visibly indicating data such as the average loading level. Additionally, the meter module 32 has a plurality of visible indicators 73, such as LEDs, for showing the state of the contactors and the system generally. The visible indicators 73 and the segments of the display 66 are driven from the outputs of latches 74 that are connected to the microprocessor bus 75. Similarly, for input from remote devices (not shown) that may be arranged to signal the microprocessor U1, the bus can be coupled to an input latch 76 for digital input. Any input latches 76 and output latches 74 share the bus such that outputs of the microprocessor U1 (and also latch outputs for the display 66) selectively address the respective latches and strobe data onto or off of the bus.

According to an inventive aspect of the invention, the microprocessor develops at least one metering output 77 representing the average current loading level. Preferably, a 4 to 20 mA current output is generated to represent loading from zero to 200% of the rated current of the contactor/load circuit. For this purpose the microprocessor U1 generates an output 78 (labelled PWMOUT in FIGS. 1 and 2) that is coupled through pulse width modulation to current converter circuit 80, shown in detail in FIG. 4.

The microprocessor U1 produces digital outputs, each having a voltage either "on" at $V_{cc}$ (e.g., +5 VDC), or "off" at ground potential. To provide an output signal that is effectively continuously variable, to represent the current loading level over a range, the microprocessor U1 develops a pulse-width modulated digital output signal wherein the proportion of on-time vs. off-time during repetitive pulse width modulation cycles represents the current loading over a range. The microprocessor U1 is programmed to operate repetitively after initialization, and has tasks that are performed synchronously with the power line frequency, which is sensed, for example, using a zero crossing detector 81 for generating an interrupt or other digital input signal SLINE (see FIG. 2) for synchronizing operation to the power line frequency. Processor U1 can complete a repetitive routine during every power cycle or over two successive cycles, etc.

The pulse width modulation period is shorter than the power line period, and the microprocessor has a crystal circuit 82 for high frequency operation enabling computations to be completed for each of the pulse width modulation periods. Zero crossings on the power line thus preferably produce either interrupts or digital status inputs. A counting subroutine subdivides the power line period into intervals, for example of 2 mS, to define the pulse width modulation period. The pulse width modulation routine executes during each of the intervals. In a preferred embodiment, the microprocessor U1 is programmed to calculate and output a timed positive pulse width of zero to 100% of the 2 mS interval, for signalling current loading of zero to 200% of the rated current of the contactor/starter 34, respectively. Thus, during each pulse width modulation cycle of the microprocessor, for example at a frequency of 500 Hz (or at the interval period of 2 mS), the microprocessor U1 maintains the output PWMOUT high for a number of passes through a subroutine for counting down a factor representing the current loading. The microprocessor U1 then switches the output to low for the remainder of the 2 mS pulse width modulation cycle. The resolution of the pulse width modulated output, i.e., the maximum value of the factor, can be 255 or hex FF, providing a resolution of ±0.4%. Therefore, the microprocessor uses one current output line for signalling the level of a variable (current loading) to a resolution that would require eight lines or bits if done digitally.

Figure 4:
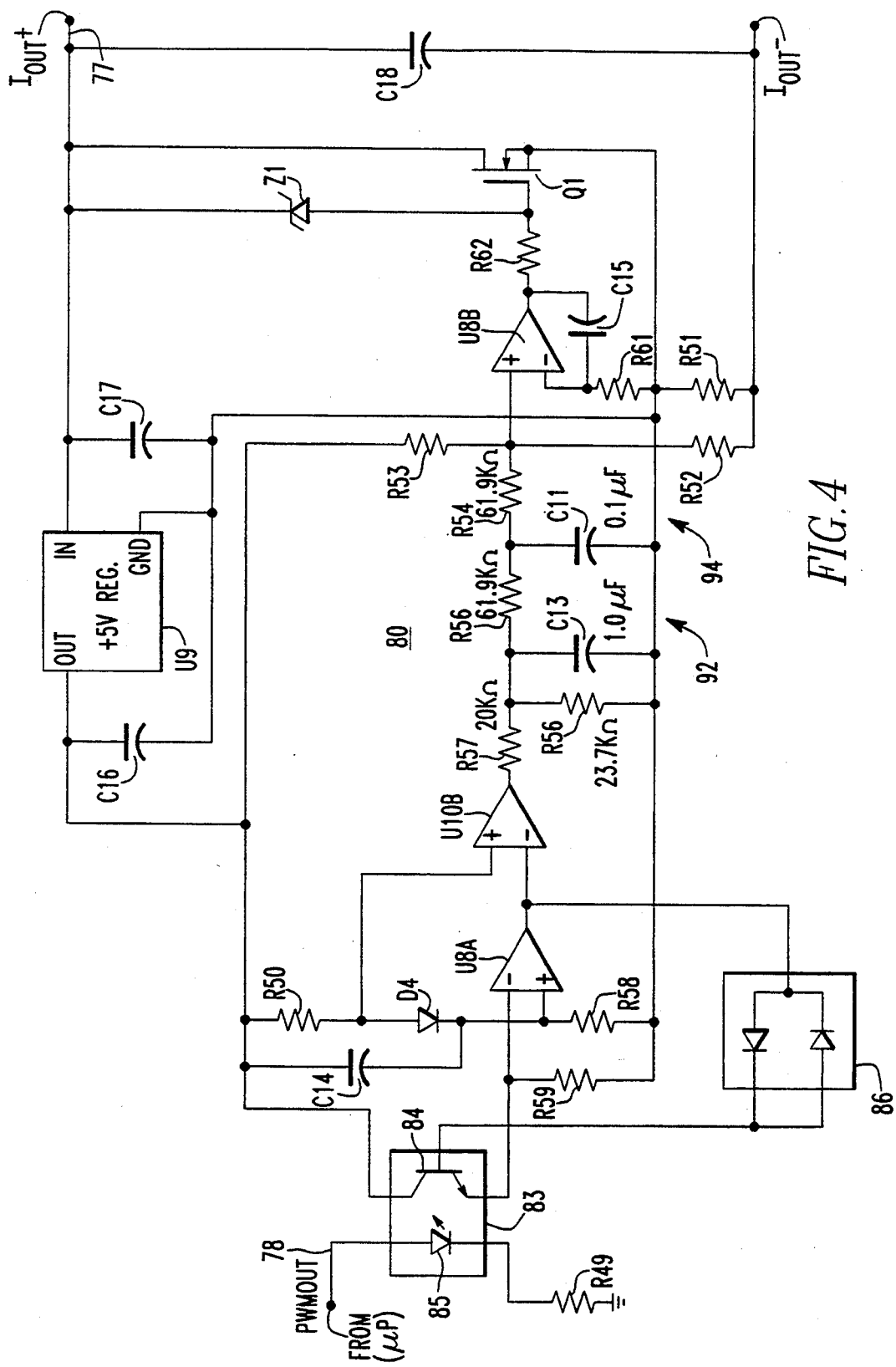
FIG. 4 is a schematic diagram showing an optically isolated pulse width modulation metering circuit according to the invention.

The pulse width modulated output PWMOUT is converted to a current signal 77 having a 4 mA offset and a full scale value of 20 mA, for representing current loading between zero and 200% of full rated current. An optically isolated metering output circuit 80 for this purpose is shown in FIG. 4. This circuit is inexpensive and effective, and improves the switching speed of the opto-coupler 83 that isolates the current output circuit 80 from the microprocessor U1 by almost a factor of ten. The fast switching of the opto-coupler circuit 80 is useful for retaining the resolution of the pulse width modulated signal 78, and the accuracy of the current output signal 77.

The output circuit 80 as shown in FIGS. 3a and 3b basically comprises an optocoupler 83 having an output phototransistor 84 responsive to an input LED 85 coupled to the PWMOUT signal 78 from microprocessor U1. The phototransistor 84 conducts current from a precision voltage regulator U9 that maintains a constant voltage at the collector of the phototransistor 84. The circuit also seeks to maintain a constant voltage at the emitter of the phototransistor 84, which is coupled to a ground reference through resistor R59 such that the circuit also maintains constant emitter current. The switching circuit comprising Schottky diode pair 86, operational amplifier U8A and comparator U10B, and associated biasing elements as shown in the drawing, changes state as a function of whether base current is being supplied to phototransistor 84 from LED 85 or from the Schottky diode pair. This switching circuit is further coupled by a drive amplifier U8B to control current output transistor Q1.

The objective is a standard two-wire 4 to 20 mA output, which is desirable for interfacing with analog to digital converters, analog meters and similar devices that may be used to record, indicate or further process current loading information. The total output current drain, with a zero input signal, must be less than or equal to 4 mA. Low power precision series voltage regulator U9 provides power and a reference voltage to the PWM-to-current converter circuit 80. The quiescent current loading of the regulator U9 by the respective components is substantially as follows:

| Device | Description | Max. Quiescent Current |
| --- | --- | --- |
| U8 | LMC662Al (National) | 1.5 mA |
| U10 | TLC3702 (Texas Instr.) | 0.065 |
| U9 (GND pin) | LP2905AC (National) | 0.17 |
| R50, D4, R58 | Voltage Reference Pts. | 0.11 |
| R59, 4N25 | Optocoupler Output | 0.42 |
| All other components | | 0.01 |

Thus the total quiescent output current is a maximum of 2.275 mA, which is below the 4 mA limit of the offset current needed according to the output specifications.

The circuit including U8A, R59, R50, D4 and the Schottky diode pair operate the optocoupler output transistor 84 at an essentially constant current of ((5 V−0.7 V)1/2)/R59=0.42 mA. Base current is either added to or subtracted from the phototransistor 84 by operational amplifier U8A to achieve this result. That is, when the optocoupler LED current is zero, amplifier U8A adds base current until the phototransistor emitter current is 0.42 mA. When the optocoupler LED 85 is being driven during the on-time of the pulse width modulation output PWMOUT from the microprocessor U1, (at about 3.5 mA), amplifier U8A removes or subtracts a portion of the photon-generated base current until the transistor emitter current is again 0.42 mA.

The two diodes of Schottky diode pair 86 detect (by their voltage drop) the direction of the base current drive signal from amplifier U8A, causing comparator U10B to change state. Comparator U10B converts the base current directional signal into a zero to 5 V digital signal which is closely in phase with the output "PWMOUT" from the microprocessor U1. One input to comparator U10B is coupled to the output of the sensing or switching amplifier U8A, and the other input is coupled to a voltage divider including resistors R50 and R58. Diode D4 is used to compensate at the U10B input for the optocoupler base-emitter voltage, and capacitor C14 decouples the inputs of the amplifiers from noise. Additionally, the ultimate power input at line $I_{OUT+}$ is filtered by capacitors C18 and C17, and a storage capacitor C16 on the output of the voltage regulator U9 further reduces noise.

The on and off switching times of the switching circuits are preferably relatively short and relatively equal, to track the PWMOUT pulse closely. Because the current in the optocoupler 83 is essentially a constant, there is only a one or two microsecond delay in switching through the phototransistor 84. The circuit thus compares very favorably with the typical delay through an opto-coupler of about 4 to 80 microseconds (at a collector current of 0.5 mA).

The Schottky diodes have a some capacitance, and their charging and discharging creates a switching delay of about one microsecond (2 pF, 1 $\mu$A, and $\Delta V=0.6$ V). The switching time of amplifier U10B adds another one to two microsecond delay, and amplifier U8A adds another microsecond. Thus, observed signal delays are two to five microseconds, with rise and fall times of about 0.1 microsecond at the output of amplifier U10B. As compared with the total pulse width modulation period of 2,000 microseconds, and the resolution of one part in 255 or one byte of data in the microprocessor ($\pm 7.8$ $\mu$S digitization error), this delay mathematically can cause only a fraction of a percent (less than 0.25%) error in the current level of the output.

The full scale of the current output preferably represents 200% of rated current. Thus the real digitization error ($\pm 1$ bit of resolution) is limited to about one percent of rated current. The nominal accuracy of the current level reported to the microprocessor U1 by the current sensor or watt sensor 44 of the contactor/starter 34 may have a typical error on the order of $\pm 5$% of rated current, which is more significant than any error generated in the encoding of the current output.

Resistors R53, R54 and R56 provide bias for the signal line between the output of comparator amplifier U10B and the input of drive amplifier U8B. Two low pass filters 92, 94 are coupled between the output of comparator operational amplifier U10B and the input of driver amplifier U8B that is coupled to the gate of output transistor Q1. The low pass filters 92, 94 reduce the ripple at the 500 Hz pulse modulation frequency. The low pass filter 92 of R57 and C13 has a time constant of about 10 mS; and the filter 94 of R55 and C11 is about 3 mS.

Amplifier U8B thus produces a voltage that varies with the duty cycle of the pulse width modulated signal PWMOUT. Amplifier U8B and output transistor Q1 convert the filtered output of comparator U10B into an output current variation of zero to 16 mA, proportional to a pulse width on-time of zero to 100% of the pulse width modulation period of 2 mS. Resistor R53 causes amplifier U8B and transistor Q1 to sink the remaining current needed to obtain a nominal fixed 4 mA offset or minimum current.

Amplifier U8B compares the load current converted to a voltage by resistor R51, and scaled and converted back to a current by resistor R52, to the PWM filtered and scaled current signal from resistor R54 and the 4 mA scaled offset signal from R53. Amplifier U8B then adjusts the drive signal applied to the gate of transistor Q1 until the scaled output current equals the scaled PWM signal plus the scaled offset signal. Thus the circuit produces the required standard 4-20 mA current output.

Figure 5A:
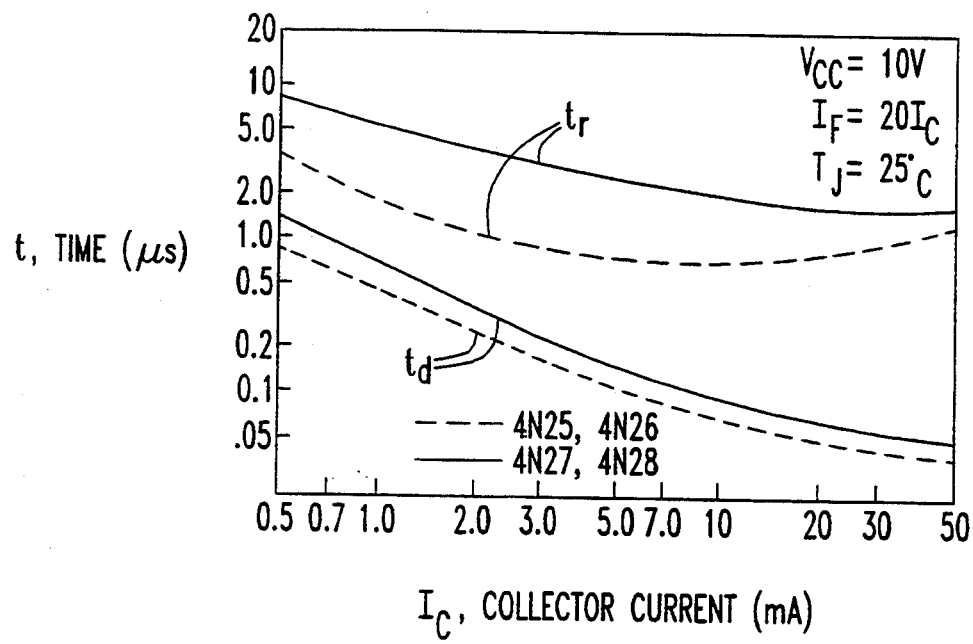
FIGS. 5a and 5b are plots of switching time vs. collector current for exemplary optical couplers.
Figure 5B:
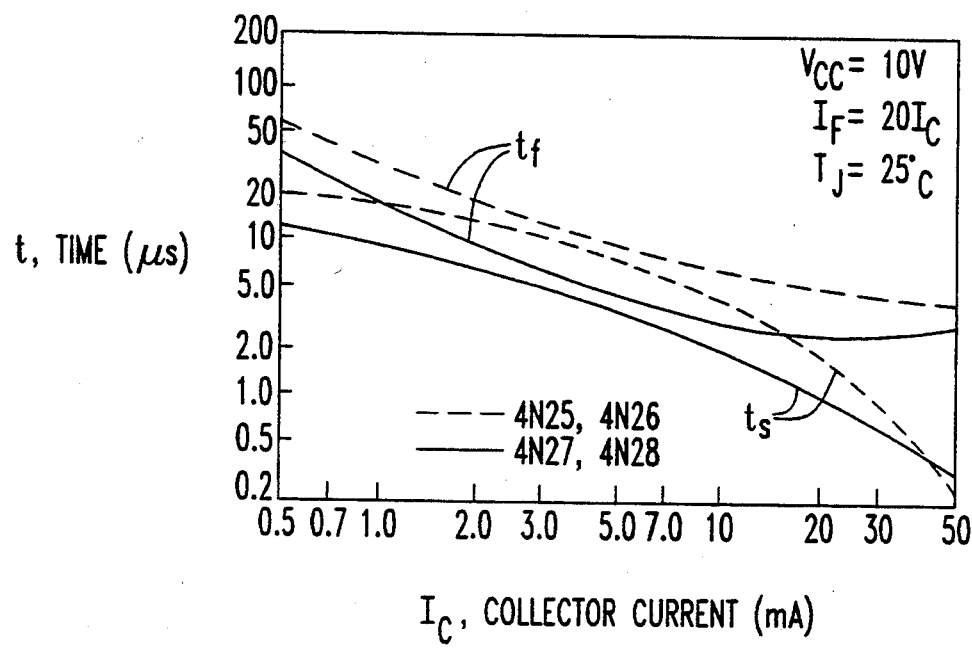

The circuit of the invention is arranged to operate the output phototransistor 84 of the optocoupler 83 at a nearly constant current while the input to the LED 85 of the optocoupler varies between full on and full off. This operation has the effect of substantially reducing the switching delay through the optocoupler circuit. As shown in FIGS. 5a and 5b, the nominal on and off switching delays of an optocoupler such as a 4N25 optocoupler are as much as 80 microseconds (off delay at $I_C=0.5$ mA). Accordingly, the circuit of the invention achieves a ten to one improvement in switching performance while limiting the current loading of the power supply to well within the 4 mA offset limitation of a standard current signal for representing the value of a process parameter.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. A metering output circuit for a pulse width modulated signal, comprising:
    a transistor having a base coupled to the pulse width modulated signal;
    a resistor coupled to an emitter of the transistor for producing a voltage varying with transistor emitter current;
    a voltage regulator operable to maintain a predetermined voltage coupled to the transistor, the voltage regulator providing a fixed reference voltage and supplying a current to a collector of the transistor;
    an amplifier coupled to the reference voltage, to the resistor and to the base of the transistor, the amplifier varying driving of the transistor base in response to the pulse width modulated signal;
    a comparator responsive to a current supplied by the amplifier to the transistor base, the comparator producing a pulse output tracking the pulse width modulated signal;
    filter means coupled to the comparator, the filter means producing a drive signal having a DC component that varies with a duty cycle of the pulse width modulated signal; and,
    a current driver coupled to the drive signal, the current driver sinking a current that varies with the DC component and with the pulse width modulated signal.

2. The metering output circuit according to claim 1, wherein the transistor is a phototransistor of an optocoupler, and wherein the amplifier is coupled to the phototransistor as an emitter follower.

3. The metering output circuit according to claim 2, further comprising a switching diode coupled between an output of the amplifier and the base of the phototransistor, and wherein the output of the amplifier is arranged to supply current to the phototransistor when the pulse width modulated signal is low, for developing a voltage responsive to the pulse width modulated signal.

4. An optically isolated metering output circuit for a pulse width modulated signal, comprising:
   means providing a reference signal;
   an optical coupler having an LED coupled to the pulse width modulated signal and a phototransistor having a base current responsive to the LED;
   an amplifier coupled to the reference signal and having an output responsive to a current in the phototransistor, the amplifier providing base current to the phototransistor as a function of the pulse width modulated signal and operating the phototransistor at a substantially fixed emitter current as compared to the reference signal;
   a comparator responsive to the output of the amplifier, the comparator producing a pulse output tracking the pulse width modulated signal;
   filter means coupled to the comparator, the filter means producing a drive signal having a DC component that varies with a duty cycle of the pulse width modulated signal; and,
   a current driver coupled to the drive signal, the current driver sinking a current that varies with the DC component and with the pulse width modulated signal.

5. The optically isolated metering output circuit according to claim 4, wherein the means providing the reference signal is a voltage regulator.

6. The optically isolated metering output circuit according to claim 5, wherein the voltage regulator is coupled to a collector of the phototransistor.

7. The optically isolated metering output circuit according to claim 4, wherein the amplifier is coupled to the phototransistor as an emitter follower, and further comprising a switching diode coupled between an output of the amplifier and a base of the phototransistor.

8. The optically isolated metering output circuit according to claim 7, wherein the current driver comprises an amplifier and an output transistor, and wherein the current driver is operable to sink 4 to 20 mA with variation of the pulse width modulated signal between zero and 100% duty cycle.

9. A system comprising a controller for a contactor circuit coupling a load to a power line, the contactor circuit being coupled to a current sensor and means for communicating to the controller a load current level, the controller comprising:
   a processor operable to produce a pulse width modulated signal having a duty cycle varying with the load current level;
   an optical coupler having an LED coupled to the pulse width modulated signal and a phototransistor whose base current is responsive to the LED;
   an amplifier having an output responsive to base current in the phototransistor, the amplifier conducting current from the phototransistor base as a function of the pulse width modulated signal;
   a comparator responsive to the output of the amplifier, the comparator producing a pulse output tracking the pulse width modulated signal;
   filter means coupled to the comparator, the filter means producing a drive signal having a DC component that varies with a duty cycle of the pulse width modulated signal; and,
   a current driver coupled to the drive signal, the current driver sinking a current that varies with the DC component and with the pulse width modulated signal.

10. The system according to claim 9, wherein the amplifier is arranged to maintain a constant emitter current in the phototransistor, whereby the amplifier output varies with illumination and lack of illumination of the phototransistor base by the LED.

11. The system according to claim 9, wherein the amplifier is coupled to the phototransistor as an emitter follower, and further comprising a switching diode coupled between an output of the amplifier and a base of the phototransistor.

12. The system according to claim 11, wherein the current driver comprises an amplifier and an output transistor, and wherein the current driver is operable to sink 4 to 20 mA with variation of the pulse width modulated signal between zero and 100% duty cycle.

13. The system according to claim 12, wherein the 100% duty cycle represents substantially 200% of a rated current of the load.

14. The system according to claim 13, further comprising means coupled to the controller along a communication path for reporting the current in the load.

* * * * *